United States Patent [19]

Shibib

[11] Patent Number: 5,894,154

[45] Date of Patent: Apr. 13, 1999

[54] P-CHANNEL MOS TRANSISTOR

[75] Inventor: Muhammed Ayman Shibib, Wyomissing, Pa.

[73] Assignee: Lucent Technologies Inc., Murray Hill, N.J.

[21] Appl. No.: 08/761,052

[22] Filed: Dec. 5, 1996

[51] Int. Cl.$^6$ .......................... H01L 29/76; H01L 29/94; H01L 31/062; H01L 29/00

[52] U.S. Cl. .......................... 257/369; 257/343; 257/408; 257/506; 257/351; 257/500

[58] Field of Search ...................... 257/343, 344, 257/369, 408, 506, 347, 350, 351, 500, 501, 502, 488

[56] References Cited

U.S. PATENT DOCUMENTS

| | | | |
|---|---|---|---|
| 5,381,031 | 1/1995 | Shibib | 257/488 |
| 5,650,658 | 7/1997 | Beason | 257/344 |

OTHER PUBLICATIONS

Tomohide Terashima et al, "Over 1000V n–ch LDMOSFET and p–ch LIGBT with JI RESURF Structure and Multiple Floating Field Plate", Proceedings of the 1995 International Symposium on Power Semiconductor Devices & ICs, Yokohama, pp. 11.2, 1995.

M. Ayman Shibib et al, "A Cost–Effective Smart Power BiCMOS Technology", Proceedings of the 7th International Symposium on Power Semiconductor Devices & ICs, Yokohama, pp. 48–53, 1995.

J.A. Appels and H.M. Jaes, "High Voltage Thin Layer Devices (Resurf Devices)", IEDM Tech. Dig., pp. 238–241, 1979.

Primary Examiner—Steven H. Loke

[57] ABSTRACT

The specification describes a p-channel MOS with self-aligned source and drain, and fabricated by a process that is fully compatible with simultaneously forming complementary self-aligned n-channel MOS devices and complementary IGBT devices.

1 Claim, 8 Drawing Sheets n-channel DMOS p-channel MOS n-channel IGBT p-channel IGBT

P-CHANNEL MOS TRANSISTOR

FIELD OF THE INVENTION

The field of this invention is MOS transistor design and fabrication for high voltage dielectrically isolated BiCMOS technology wherein the fabrication of improved p-channel MOS devices is fully compatible with the fabrication of complementary MOS devices and complementary IGBT devices.

BACKGROUND OF THE INVENTION

This application is related to my copending application U.S. patent application Ser. No. 754,607, filed Nov. 20, 1996 which is incorporated herein by reference. In that application, an improved p-channel IGBT device is described which is fully compatible with a generic process for making complementary pairs of MOS devices as well as IGBT devices. In this application I will describe a modification of that generic process to form an improved p-channel MOS device.

In a typical high voltage BiCMOS technology the n-channel high voltage MOS transistors are self-aligned or double diffused (DMOS). The complementary device, the p-channel device, is frequently not self-aligned or double diffused to keep the process complexity, and the cost, down. This results in less than optimum performance for the p-channel devices, e.g. higher on-resistance, and wider variation in manufacturing. In a non-self-aligned process greater margins are typically required for feature alignment and the overall device size is typically greater resulting in a decrease in device packing density and a proportional increase in cost.

As pointed out in my earlier application, device design in BiCMOS fabrication is heavily dependent on processing compatibility so a design improvement that appears advantageous for one type of device is only effective if it can be made within the constraints of the overall IC process. Thus, although it is easy to design a p-MOS device with a self-aligned gate, a way to do so within the constraints of the typical BiCMOS technology has not been available in the prior art.

STATEMENT OF THE INVENTION

I have developed an improved p-channel MOS device design that is fully compatible with an efficient and reliable dielectrically isolated BiCMOS fabrication process for complementary IGBTs and CMOS devices. The improved p-channel MOS device has a quasi-self-aligned gate without any additional process complexity and cost in the overall generic BiCMOS process. The result is a more efficient process with better yield, and better p-channel device performance, e.g. improved on-resistance.

BRIEF DESCRIPTION OF THE DRAWING

FIGS. 4-15 are schematic representations of the process step sequence of the invention showing the process sequence

2 compatibility and the process step commonality for four types of devices being fabricated simultaneously;

DETAILED DESCRIPTION

Figure 1:
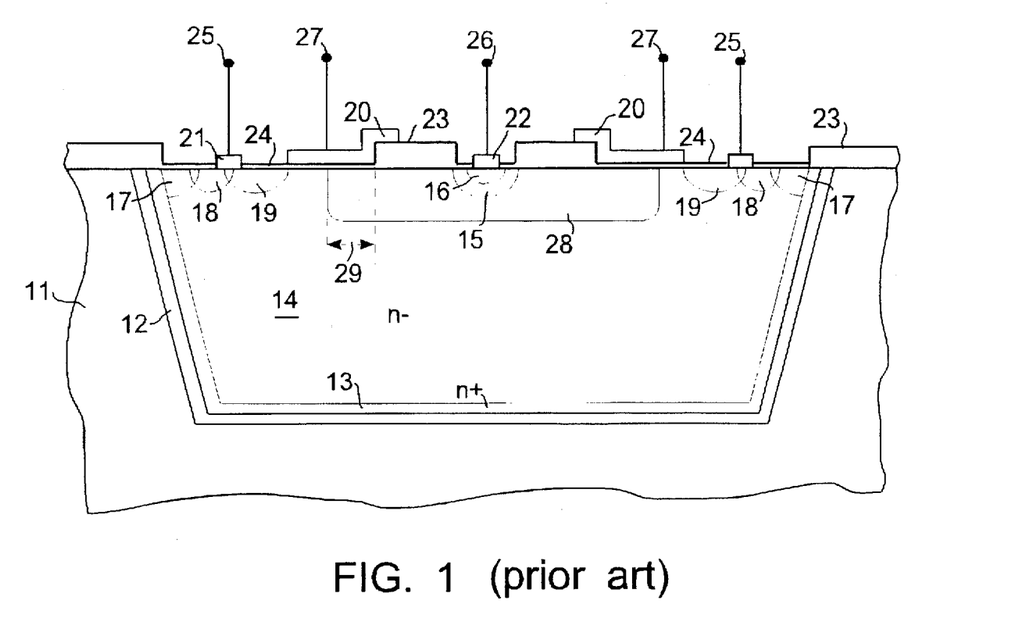
FIG. 1 is a schematic view of a p-channel MOS device made by the conventional process and in which the channel is not self-aligned to the gate.

Referring to FIG. 1 the basic dielectrically isolated structure is shown with polysilicon substrate 11 surrounding the oxide isolating layer 12 and the silicon device substrate 13 within the dielectric layer. This structure is formed by grooving a single crystal silicon wafer, growing the thick oxide dielectric, depositing polysilicon over the grown dielectric, inverting the structure, and grinding the silicon to a thickness level that leaves the isolated silicon regions as shown. The techniques used to form dielectrically isolated silicon wafers are well established in the art. The dielectrically isolated structure shown is one of thousands in a typical DI silicon wafer. The n+ layer 13 is a conventional guard ring layer formed in this technology over the whole structure prior to growing the oxide layer 12. The silicon substrate 14 is standard lightly doped n-type material.

In the generic process, typically all the devices are formed in n-type tubs 14. The drain region is shown as p-type region 15 with heavily doped p-type contact 16. The source consists of peripheral guard ring 17, n-region 18, and $p^+$ region 19 defining the edge of the p-channel. The silicon gate is shown at 20 and the source and drain electrodes at 21 and 22. The field oxide is indicated schematically by 23 and the thin gate dielectric by 24. The interconnections for the source, drain, and gate are shown schematically as 25, 26 and 27. The $p^-$ drift region, the characteristic of power MOS transistors, is shown at 28. The drift region 28 extends beneath the field oxide 23 and is formed early in the process. The outer edge of the p-channel, defined by $p^+$ region 19, can be self-aligned to the polysilicon gate, as will be appreciated from the configuration shown in FIG. 1 and the process description below. The inner extent of the channel however depends on a lithographic mask alignment step to place the edge of the gate 20 over the inner edge of the p-channel that is already in place. Thus typically the features in these devices are larger than would be the case if they were self-aligned to allow an additional mask alignment tolerance, and the channel length cannot be precisely controlled. An additional negative consequence of a non-self-aligned gate is indicated at 29 in FIG. 1, and is the excessive overlap of the gate 20 on the drift region 28 at the edge of the channel. This overlap is necessary in a mask registered process, as contrasted with a self-aligned process, to ensure that the gate covers the entire channel. Not only does the channel length vary with the alignment accuracy, and thus the speed of the transistor, but the Miller capacitance of the device is excessive.

Figure 2:
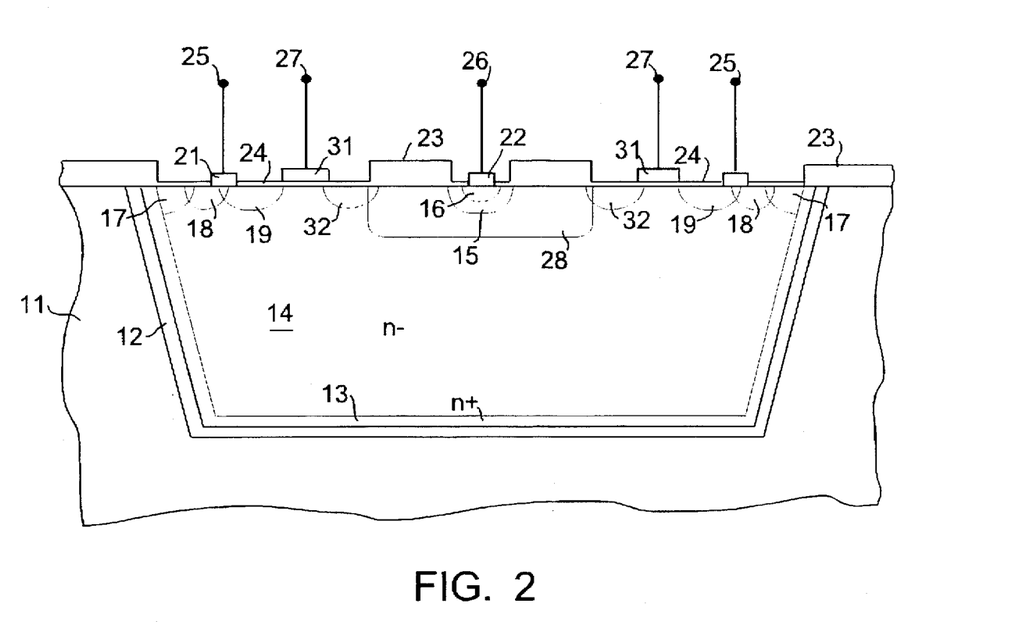
FIG. 2 is a schematic view similar to FIG. 1 showing the structure of a p-channel made by the process modification of the invention showing the quasi-self-aligned gate.

An improved p-channel MOS structure according to the invention is shown in FIG. 2. As will be more fully appreciated in the process sequence described below, the device is almost identical to the device of FIG. 1 in terms of the processing steps and sequence. To show the commonality, the same reference numbers used in FIG. 1 will be used in this figure to designate the common elements where those elements are the same. The basic DI structure, i.e. substrate 11, dielectric isolation oxide 12, guard region 13, and n-tub 14 are the same as in FIG. 1. The source region is the same, comprising elements 17,18 and self-aligned source edge 18. The drain region has common elements 15 and 16. The drift region 28 in FIG. 2 is similar to the drift region of the prior art (28 in FIG. 1) except that it is confined to the region beneath the field oxide 23, i.e. it does not extend beneath the gate dielectric 24. The other distinctions appear in the gate structure 31 which in this structure is wholly situated in this view on the gate dielectric 24, and does not extend up over the field oxide 23 as it does in FIG. 1. This arrangement results in a space between the inside edge of the gate electrode 31 and the edge of the p-drift region 28. Into that space a p⁺ region is implanted as shown at 32. The implanted region 32 is self-aligned with respect to the edge of the gate and overcomes the deficiencies of the non-aligned structure of FIG. 1. It is preferred that the p⁺ added region 32 is formed in the same step that the source p⁺ region 19 is formed.

Several of the elements in these figures, e.g. regions 17,18,19, and 32 and the electrodes in these structures, appear as two elements in each device but as known to those skilled in the art of power transistors these elements are ring shaped and thus form a single element.

Figure 3:
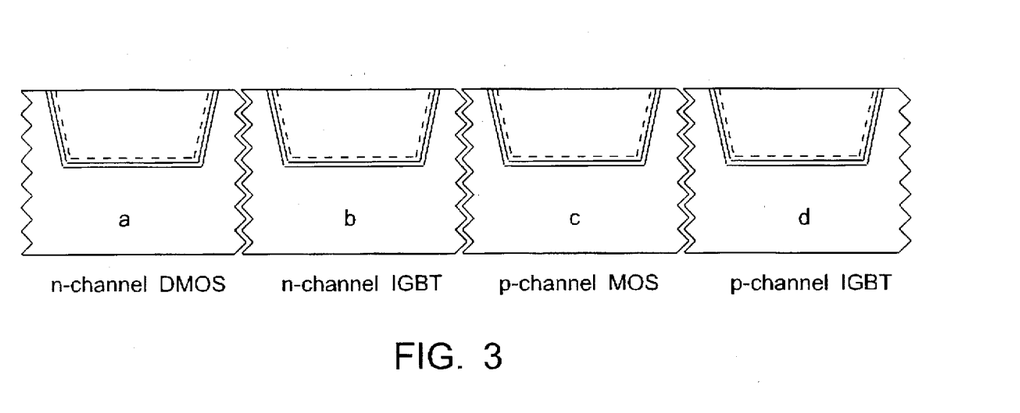
FIG. 3 is a schematic representation of a portion of a substrate wafer being processed according to the invention and shows the break away format used in the subsequent process step representations.

An important aspect of the invention is the compatibility of the process for making the p-channel MOS device of FIG. 2 with a process for making a complementary MOS device, and for making complementary pairs of high voltage insulated gate bipolar transistors (IGBTs) using a common process sequence. Accordingly, the following process description shows the simultaneous formation of four device varieties: p-channel MOS, n-channel DMOS, p-channel IGBT, and n-channel IGBT. Each device is shown in each figure broken apart for clarity. In FIG. 3, the four devices are shown as a single substrate with the break marks as indicated to illustrate the format used in the subsequent process sequence. The varieties of devices shown in the figure is by way of example only, as is the order in which the devices are placed. A typical high voltage IC will have hundreds of devices arranged according to the particular IC design being manufactured.

Figure 4:
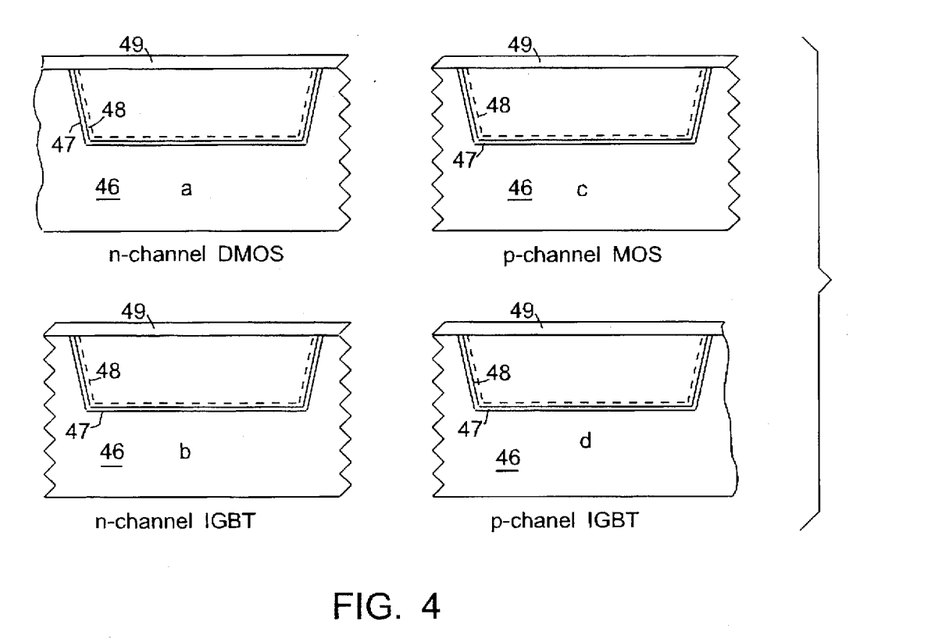

Referring to FIG. 4, shown is the polysilicon substrate 46, with the conventional dielectric isolation regions formed by oxide 47, and guard layer 48. The substrate material within the dielectrically isolated tubs is <100> oriented silicon doped n⁻. After standard cleaning, an initial oxide layer 49, 0.5 to 1.0µ thick, is grown on the silicon surface by steam oxidation.

Figure 5:
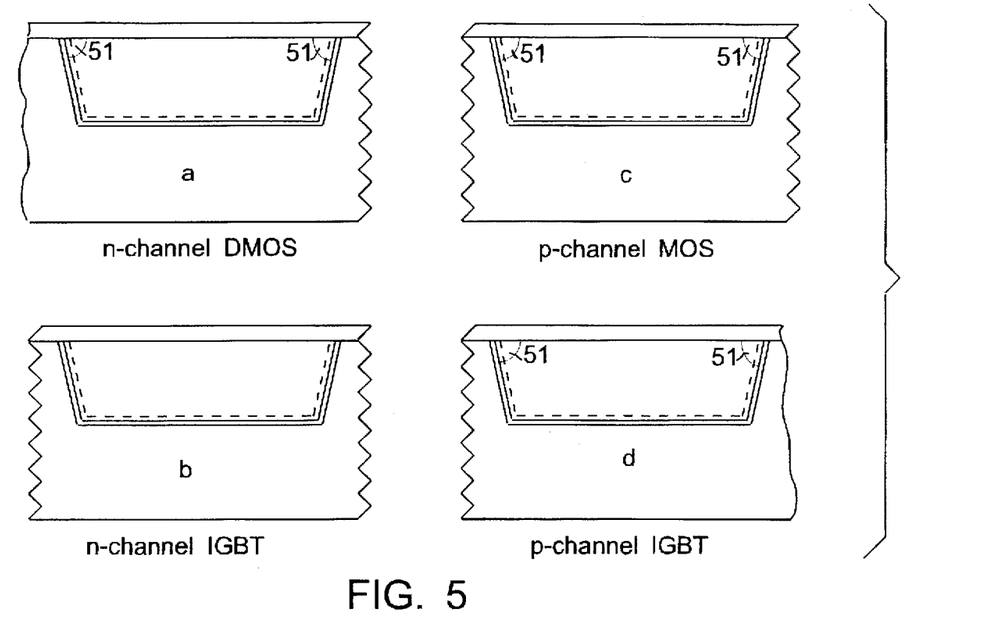

FIG. 5 shows n⁺ regions 51 in the selected devices shown to form n⁺ contacts. In this example, the n⁺ regions are formed by photomasking the oxide above the n⁺ region, etching the exposed areas with hot HF, followed by .a phosphorus predeposit and wet oxidation drive.

It will be understood by those skilled in the art that those process steps described here that require selective processing can be achieved by well known photolithographic masking techniques, and standard etching, ion implantation, oxide growth or deposition as required, metal deposition and patterning, etc. These various process steps are sufficiently established in the IC wafer fabrication art that the details are unnecessary to the practice of the invention. For those details, reference is made to Tomohide Terashima et al, "Over 1000V n-ch LDMOSFET and p-ch LIGBT with JI RESURF Structure and Multiple Floating Field Plate", Proceedings of the 1995 International Symposium on Power Semiconductor Devices & ICs, Yokohama, pp. 11.2, 1995; M. Ayman Shibib et al, "A Cost-Effective Smart Power BiCMOS Technology", Proceedings of the 7th International Symposium on Power Semiconductor Devices & ICs, Yokohama, pp. 48–53,1995.

It is also understood that the elements in the figures are not drawn to scale, or in some cases, in the interest of clarity, not even approaching scale. The figures are schematic front sectional views and show certain elements, e.g. polysilicon gates, as two separate bodies. Those skilled in the art of power transistors understand that elements of these devices are circular shaped, or shaped in a polygon for close packing in an array.

Also for clarity, the reference numerals in each figure denote the elements that are added or changed in the process step associated with that figure. In most cases the masking layer is not shown, or is not shown patterned.

Figure 6:
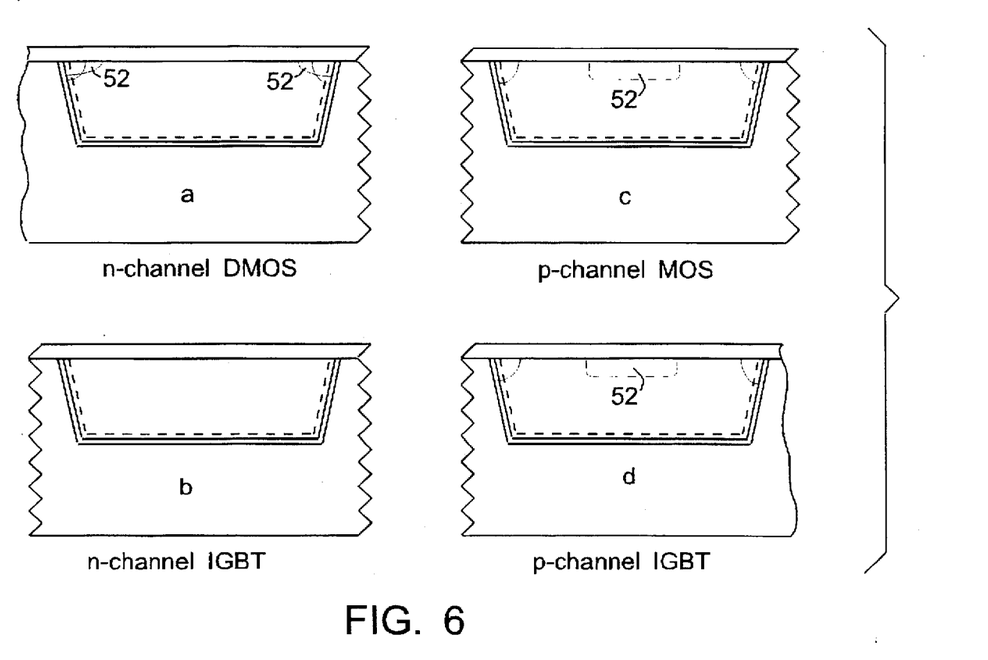

In FIG. 6 the so-called p-resurf layer 52 is formed. Details of the purpose and formation of this layer are given by J. A. Appels and H. M. Jaes, "High Voltage Thin Layer Devices (Resurf Devices)", IEDM Tech. Dig., pp. 238–241, 1979, and in my paper, "A Cost Effective Smart Power BiCMOS Technology", referenced above. Also see my U.S. Pat. No. 5,381,031, which is incorporated herein by reference. In the process of this invention the p-resurf layer defines the p-drift region for the improved p-channel MOS device. It also forms the drift region for the n-channel or DMOS device. According to the invention, the mask for the p-drift region in the p-channel MOS device has been reduced in size compared to the one used for the prior art device of FIG. 1 in order to place the p-drift region essentially beneath the field oxide as shown in FIG. 2.

The p-resurf layer 52 may be formed in this example by boron implant at a dose of 5.5 E12 and energy of 30 kEV, followed by a drive for 60 min. at 1200° C. The p-resurf formation is followed by a wet oxidation at 1150° C. for approximately 6 hours to form approximately 2µ of field oxide as shown in FIG. 7.

Figure 7:
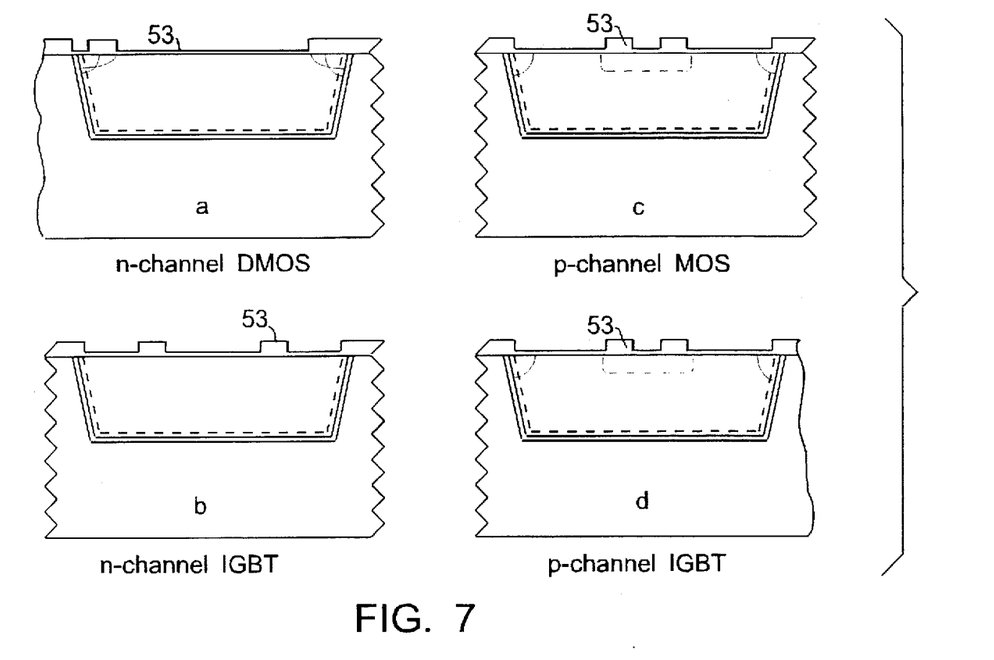

The oxide layer is patterned and the thin oxide regions regrown to form the thick and thin oxide layer 53 of FIG. 7. The main portion of the thick oxide, the field oxide, in the p-channel MOS device is grown over the entire p-drift implant essentially as shown, leaving a center opening as shown for the drain contact region. The thin oxide regions form the gate dielectric for the MOS portions of the devices. The thickness of the thin oxide layer is typically 500–1000 Angstroms.

Figure 8:
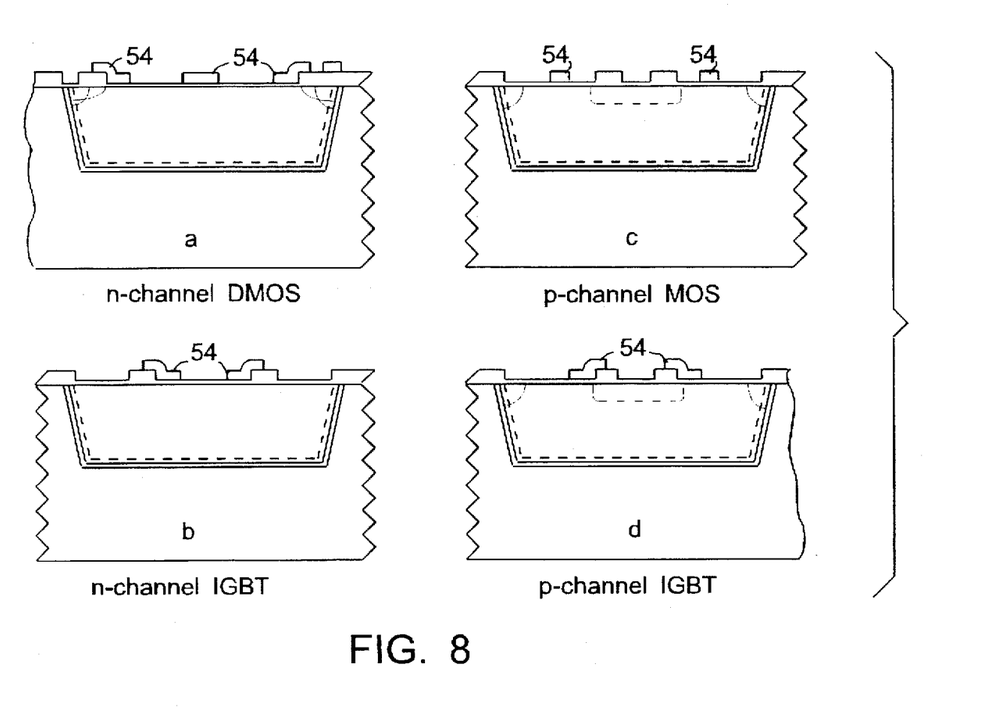
Figure 9:
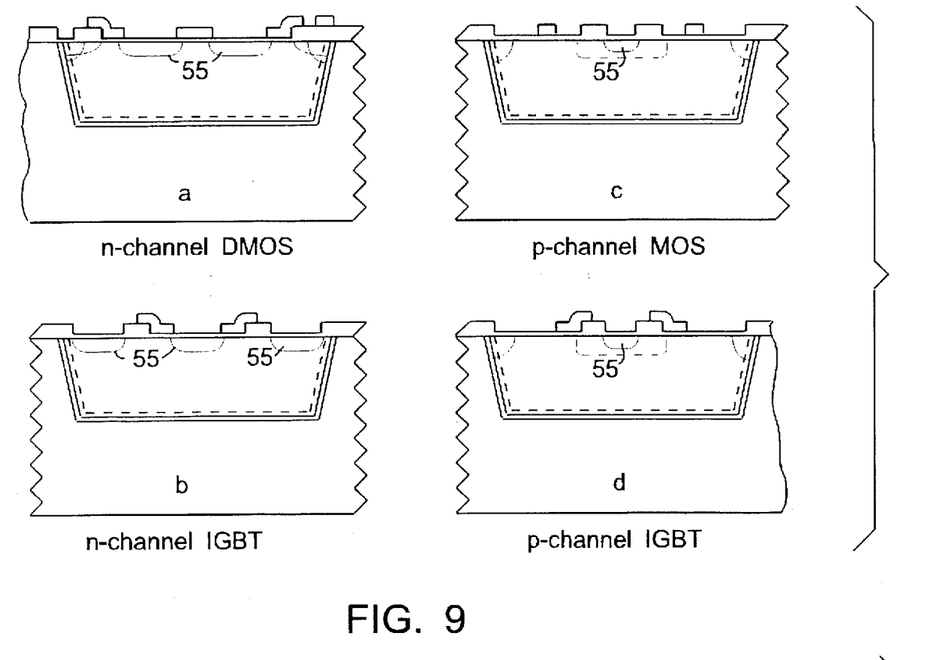

Next the polysilicon gates 54 are formed by depositing a CVD polysilicon layer and patterning the layer to produce the structure shown in FIG. 8. The polysilicon gates, in combination with the thin oxide regions form the alignment for the p-body implant shown in FIG. 9. In particular the polysilicon gate ring electrode ring in the n-channel devices self-aligns the implanted p-regions to the gate edge. In the improved p-channel MOS device the polysilicon gate formed as shown in FIG. 8 is confined to the thin gate dielectric layer, leaving space at the inner edge of the polysilicon gate for implanting a p⁺ region to couple, and self-align, the p-drift region to the edge of the gate, as will be seen in the next step. The p-regions 55 are formed as shown in FIG. 9 by conventional boron implant and drive. The boron dose may be 6.0 E13 at an implant energy of 60 kEV. The p-body implant in the p-channel MOS device forms the drain region 15 of FIG. 2.

Figure 10:
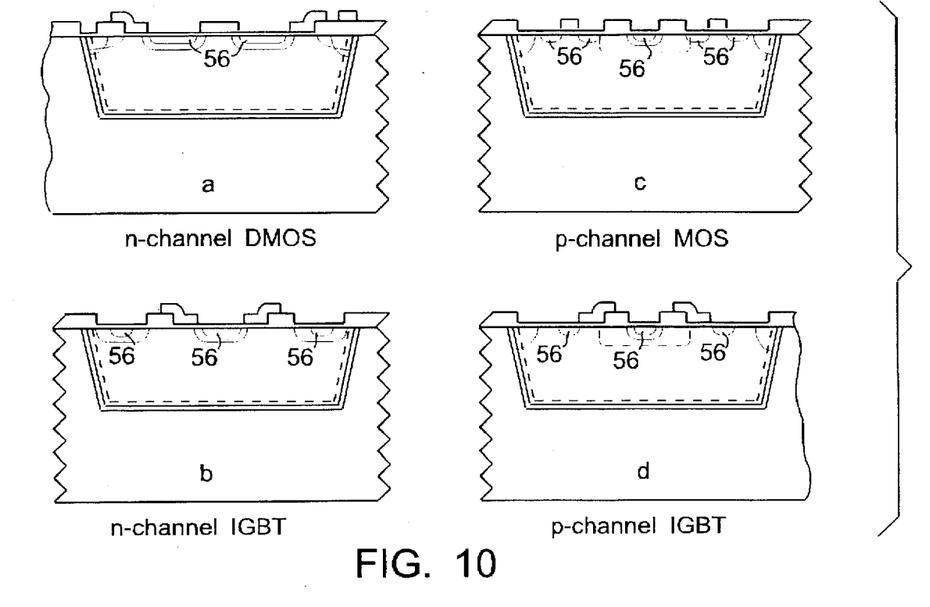

The p-body implant is followed by a shallow p-implant, 2.0 E15 at 60 kEV to form regions 56 in FIG. 10. The shallow p-implanted regions 56 form p⁺ contact regions for the n-channel power devices, and defines the source for the p-channel IGBT. For the improved p-channel MOS device, this implant step forms the source region that is self-aligned to the gate, shown at 19 in FIG. 2, and also forms the region 32 of FIG. 2, the region that self-aligns and couples the p-drift portion of the drain of the MOS device, 28 of FIG. 2, to the edge of the gate 31 thus self-aligning both the source and drain of the p-channel MOS device.

Figure 11:
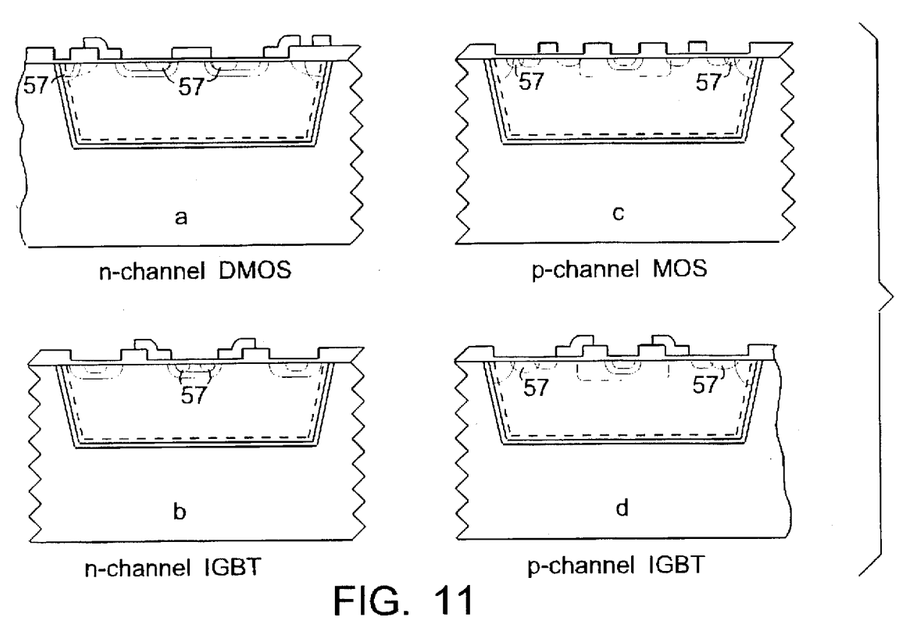
Figure 12:
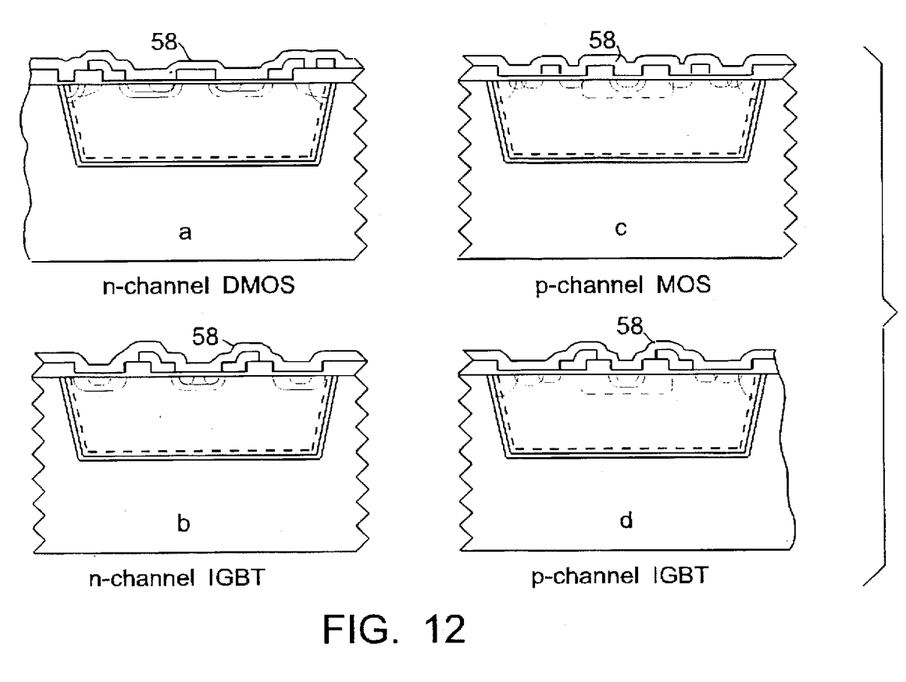
Figure 13:
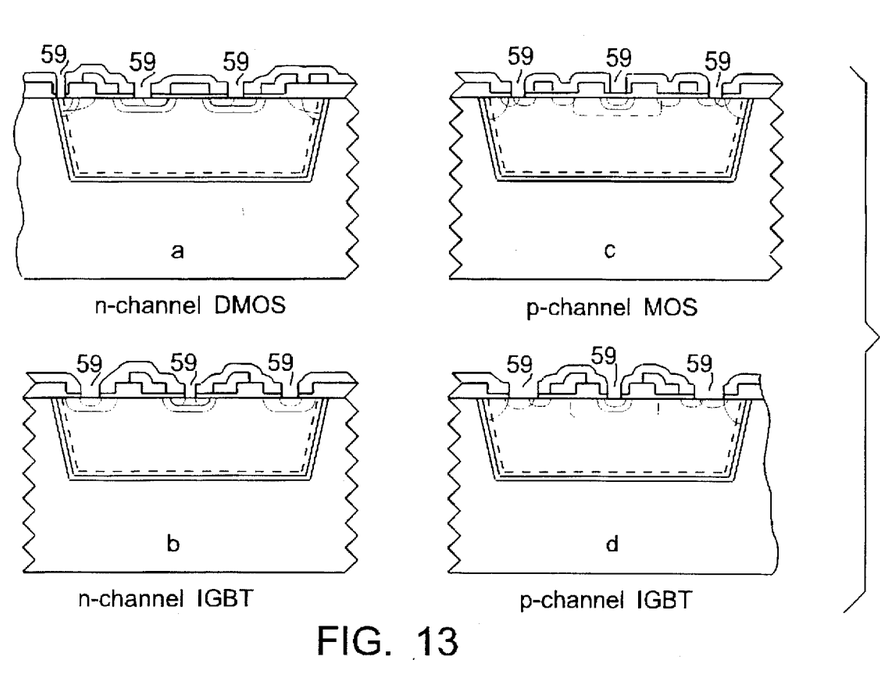
Figure 14:
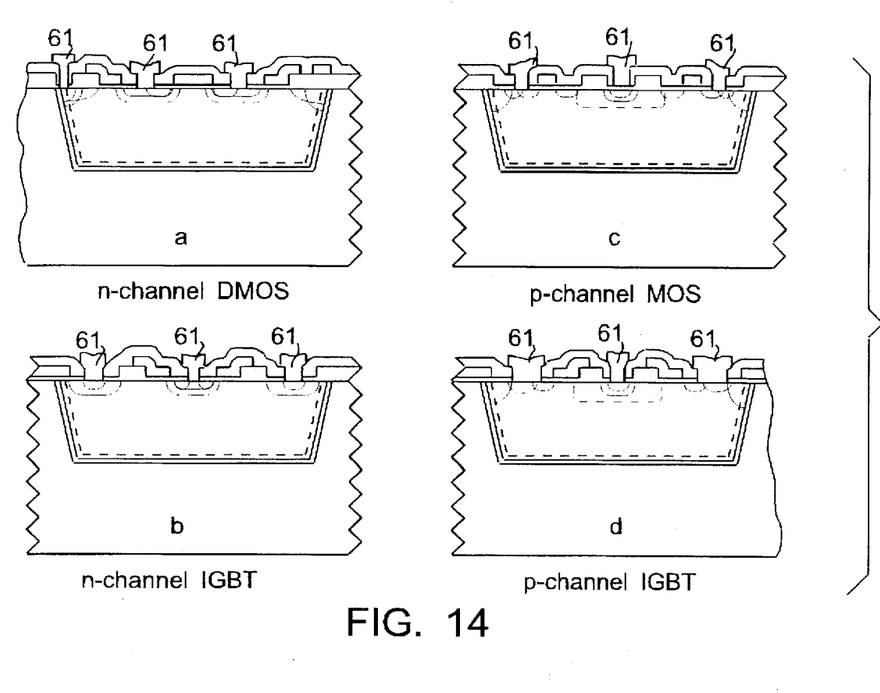
Figure 15:
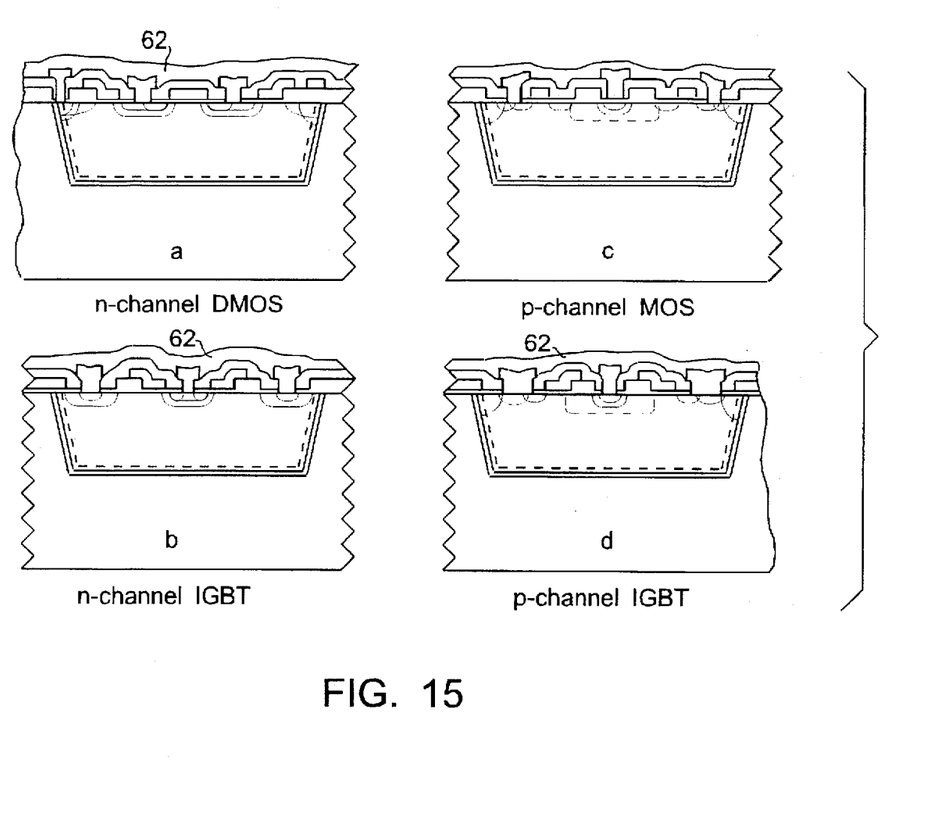

The n-source regions for the n-channel devices, and the n-portion of the p-channel IGBT drain are formed at 57 in FIG. 11. For the p-channel MOS device, this n-type implant forms the region 18 of FIG. 2, part of the source contact for the device. A standard phosphorus implant, 3.0 E15 at 160 kEV, may be used to form the n-regions shown. Next a p-glass layer 58 is deposited as shown in FIG. 12, and patterned as shown in FIG. 13 for the contact windows 59. Aluminum metallization is formed over the patterned structure of FIG. 13 and itself patterned to form the metallization for the IC as indicated schematically at 61 in FIG. 14. A standard SINCAP layer 62, shown in FIG. 15, is deposited to passivate the final IC structure.

It is evident from the foregoing that the same process step sequence, with essentially total process commonality, was used to form each of four device varieties. Of significance to the invention, the p-channel MOS device of FIG. 2, with a gate self-aligned to the drain as well as the source, was integrated with the process for the other devices without additional steps or process complexity.

Using the self-aligned technique of the invention, the channel length can be precisely controlled, and the transistor characteristics, e.g. speed and gate drain capacitance, can be reproduced reliably and the devices manufactured with high yield. Moreover, due to the self-alignment, the required alignment tolerance (dimension) is reduced thus allowing a more compact transistor design. The device of the invention is essentially a self-aligned silicon gate MOS transistor in series with a drift region to sustain the voltages necessary in high voltage ICs. In terms of performance, in addition to those qualities already mentioned, the improved device has lower on-resistance.

In the typical CMOS IC device the n-channel transistors are required to have higher performance than the p-channel devices and thus in the usual case the process is designed so that the n-channel devices are self-aligned and the p-channel gates are mask aligned. With the advance in the art made possible by this invention the process designer has greater design freedom.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. An integrated circuit comprising a complementary pair of insulated gate high voltage MOS transistors (MOS) wherein both the p-channel device and the n-channel device of the complementary pair have essentially self-aligned gates, and a complementary pair of insulated gate bipolar transistors(IGBT), said complementary pair of insulated gate high voltage MOS transistors comprising:

a. a pair of dielectrically isolated n-type tubs, a first of said pair of tubs being designated for an n-channel MOS transistor (NC-MOS) and designated the NC-MOS tub, and the second of said pair of dielectrically isolated n-type tubs being designated for a p-channel MOS transistor (PC-MOS) and designated the PC-MOS tub, b. a field oxide covering selected portions of the substrate in both the NC-MOS MOS tub and the PC-MOS tub leaving portions of the substrate uncovered by the field oxide, c. a gate dielectric on said portions of the substrate uncovered by the field oxide, d. a first NC-MOS n-type region in the NC-MOS tub adjacent the edge of the tub serving as the drain of the NC-MOS transistor, e. a first PC-MOS n-type region in the PC-MOS tub serving as part of the source for the PC-MOS transistor, f. a first PC-MOS p-type region in the PC-MOS tub serving as part of the drain of the PC-MOS transistor, g. a first NC-MOS p-type region in the NC-MOS tub overlapping said first n-type region of the NC-MOS tub and serving as a p-resurf region, h. a polysilicon NC-MOS gate electrode in the NC-MOS tub, i. a ring-shaped polysilicon PC-MOS gate electrode in the center portion of the PC-MOS tub, with a substantial portion of the electrode spaced from the field oxide on both sides of said PC-MOS gate electrode, j. a second NC-MOS p-type region in the NC-MOS tub, said second NC-MOS p-type region being circularly shaped and located in the center region of the NC-MOS tub, said second NC-MOS p-type region being self-aligned with the NC-MOS polysilicon gate electrode, k. a second PC-MOS p-type region in the PC-MOS tub substantially contained within said first PC-MOS p-type region to form a portion of the drain of the PC-MOS transistor, l. a third NC-MOS p-type region in the NC-MOS tub substantially contained within said second NC-MOS p-type region to form a portion of the NC-MOS transistor source contact, m. a third PC-MOS p-type region in the PC-MOS tub substantially contained within said PC-MOS second p-type region to form a portion of the PC-MOS transistor drain, n. a fourth PC-MOS p-type region in the PC-MOS tub, said fourth PC-MOS p-type region in the space between the PC-MOS gate electrode and said first PC-MOS n-type region and self-aligned with the PC-MOS gate electrode, said fourth PC-MOS p-type region comprising the source for the p-channel MOS transistor, o. a fifth PC-MOS p-type region in the PC-MOS tub, said fifth PC-MOS p-type region in the space between the PC-MOS gate electrode and the first PC-MOS p-type region, said fifth PC-MOS p-type region self-aligned with the PC-MOS gate electrode and overlapping at least a portion of said first PC-MOS p-type region, said fifth PC-MOS p-type region comprising, in combination with said second PC-MOS p-type region, the PC-MOS drain, p. a second NC-MOS n-type region in the NC-MOS tub, said second NC-MOS n-type region substantially contained within said first NC-MOS n-type region and comprising NC-MOS drain, q. a third NC-MOS n-type source region in the NC-MOS tub, said third NC-MOS n-type source region substantially contained within said second NC-MOS p-type region and adjacent to, and overlapping at least a portion of, said third NC-MOS p-type region, and r. a second PC-MOS n-type region in the PC-MOS tub, said second PC-MOS n-type region substantially between said first PC-MOS n-type region and said fourth PC-MOS p-type region and overlapping at least a portion of said first PC-MOS n-type region and said fourth PC-MOS p-type region, said second PC-MOS n-type region, combined with said fourth PC-MOS p-type region, comprising the PC-MOS source, and s. metal contacts for the source, drain and gate of both the PC-MOS and the NC-MOS, said complementary pair of insulated gate bipolar transistors comprising:

a'. a plurality of dielectrically isolated n-type tubs, a first of said dielectrically isolated n-type tubs being designated for an n-channel IGBT (NC-IGBT) and designated the NC-IGBT tub and a second of said dielectrically isolated n-type tubs being designated for a p-channel IGBT (PC-IGBT) and designated the PC-IGBT tub, b'. a first n-type region in said PC IGBT tub adjacent the edge of the PC-IGBT tub forming part of the source contact for the PC-IGBT, c'. a first PC-IGBT p-type region in the center portion of said PC-IGBT tub, and spaced from said first PC-IGBT n-type region, d'. a ring-shaped polysilicon MOS gate electrode in the center portion of each of the NC-IGBT tub and the PC-IGBT tub, said MOS gate electrode in the PC-IGBT tub overlying the edge of said first PC-IGBT p-type region, e'. a first NC-IGBT p-type region in the NC-IGBT tub, said first NC-IGBT p-type region being circularly shaped and located in the center of the NC-IGBT tub and being aligned to the ring shaped polysilicon MOS gate electrode in the NC-IGBT tub, f'. a second NC-IGBT p-type region in the NC-IGBT tub surrounding and spaced from said first NC-IGBT p-type region to form a portion of the NC-IGBT drain, g'. a second PC-IGBT p-type region in the PC IGBT tub substantially contained within said first PC-IGBT p-type region to form a portion of the PC-IGBT drain, h'. a third NC-IGBT p-type region in the NC-IGBT tub substantially contained within said second NC-IGBT p-type region to form a portion of the NC-IGBT drain, i'. a fourth NC-IGBT p-type region in the NC-IGBT tub substantially contained within said first NC-IGBT p-type region, j'. a third PC-IGBT p-type region in the PC-IGBT tub in the space between said first PC-IGBT p-type region of the PC-IGBT and the first PC-IGBT n-type region of the PC-IGBT to form a portion of the PC-IGBT source, and to define the MOS channel region of the PC-IGBT between said first PC-IGBT p-type region and said third PC-IGBT p-type region, said third PC-IGBT p-type region being aligned with the PC-IGBT polysilicon MOS gate electrode, k'. a first NC-IGBT n-type region substantially contained within said first NC-IGBT p-type region in the NC-IGBT tub and abutting said fourth NC-IGBT p-type region of the NC-IGBT tub, l'. a second PC-IGBT n-type region in the PC-IGBT tub overlapping both said first PC-IGBT n-type region of the PC-IGBT tub and the third PC-IGBT p-type region of the PC-IGBT tub, m'. metal contacts for the source, gate and drain of both the PC-IGBT and the NC-IGBT.

* * * * *